US008842148B2

(12) United States Patent
Fukuma

(10) Patent No.: US 8,842,148 B2
(45) Date of Patent: Sep. 23, 2014

(54) IMAGE FORMING DEVICE WITH FINS HAVING INCREASING HEIGHT

(71) Applicant: Kyocera Document Solutions Inc., Osaka (JP)

(72) Inventor: Nobuhiro Fukuma, Osaka (JP)

(73) Assignee: KYOCERA Document Solutions Inc., Osaka (JP)

( * ) Notice: Subject to any disclaimer, the term of this patent is extended or adjusted under 35 U.S.C. 154(b) by 0 days.

(21) Appl. No.: 13/754,418

(22) Filed: Jan. 30, 2013

(65) Prior Publication Data

US 2013/0250028 A1 Sep. 26, 2013

(30) Foreign Application Priority Data

Mar. 23, 2012 (JP) ................................ 2012-066930

(51) Int. Cl.

| | |
|---|---|
| ***B41J 15/14*** | (2006.01) |
| ***B41J 27/00*** | (2006.01) |
| ***H05K 7/20*** | (2006.01) |
| ***G03G 21/20*** | (2006.01) |
| ***G03G 21/16*** | (2006.01) |

(52) U.S. Cl.

CPC .......... *G03G 21/206* (2013.01); *G03G 21/1666* (2013.01)

USPC ............................ 347/243; 347/261; 361/703

(58) Field of Classification Search

USPC ......................... 347/231, 241–243, 256–261; 361/701–711

See application file for complete search history.

(56) References Cited

U.S. PATENT DOCUMENTS

| | | | | |
|---|---|---|---|---|
| 6,172,786 | B1 * | 1/2001 | Fujita et al. | 359/200.1 |
| 6,356,722 | B1 * | 3/2002 | Kida | 399/92 |
| 6,449,107 | B2 * | 9/2002 | Tachibe et al. | 359/819 |
| 7,326,861 | B2 * | 2/2008 | Kojima | 174/350 |
| 8,004,735 | B2 * | 8/2011 | Murakami et al. | 359/216.1 |
| 8,325,480 | B2 * | 12/2012 | Bridges et al. | 361/679.54 |
| 2004/0175202 | A1 * | 9/2004 | Fujita | 399/92 |
| 2008/0025750 | A1 * | 1/2008 | Yamazaki et al. | 399/92 |
| 2008/0144279 | A1 * | 6/2008 | Yamamoto et al. | 361/694 |
| 2011/0129259 | A1 * | 6/2011 | Nakano et al. | 399/221 |

FOREIGN PATENT DOCUMENTS

| | | | | | |
|---|---|---|---|---|---|
| JP | 10206776 | A | * | 8/1998 | G02B 26/10 |
| JP | 11-160644 | | | 6/1999 | |
| JP | 2001004945 | A | * | 1/2001 | G02B 26/10 |
| JP | 2002261477 | A | * | 9/2002 | H05K 7/20 |
| JP | 2003043394 | A | * | 2/2003 | G02B 26/10 |
| JP | 2008235387 | A | * | 10/2008 | H05K 7/20 |

* cited by examiner

*Primary Examiner* — Hai C Pham

(74) *Attorney, Agent, or Firm* — Studebaker & Brackett PC

(57) ABSTRACT

An image forming device includes an exposure device configured to emit exposure light and an air flow generator configured to generate an air flow. The exposure device includes a heat source that generates heat and a heat sink configured to dissipate the heat. The heat sink includes a plurality of fins located inside the air flow. The plurality of fins extend in a direction parallel to a direction where the air flow flows and are arrayed in a direction orthogonal to the direction where the air flow flows. The plurality of fins are formed so as to increase in height from an upstream side toward a downstream side in the direction where the air flow flows.

2 Claims, 9 Drawing Sheets

IMAGE FORMING DEVICE WITH FINS HAVING INCREASING HEIGHT

INCORPORATION BY REFERENCE

The present application claims priority under 35 U.S.C. §119 to Japanese Patent Application No. 2012-066930, filed Mar. 23, 2012. The contents of this application are incorporated herein by reference in their entirety.

BACKGROUND

The present disclosure relates to image forming devices, such as copiers, printers, facsimile machines, multifunction device thereof, etc.

Image forming devices, such as copiers and the like include an exposure unit (exposure device). The exposure unit irradiates laser light to the surface of a photosensitive drum to form an electrostatic latent image. The exposure unit includes a light source that emits laser light, optical components, such as a lens that images the emitted laser light, a polygon mirror that deflects the laser light, etc., a motor that drives and rotates the polygon mirror, and a casing that accommodates them.

The motor (polygon motor) acts as a heat source in the exposure unit. Accordingly, in order to continuously perform stable exposure, it is preferable to dissipate heat generated at the motor outward of the exposure unit to suppress influence of heat storage on the optical components and the like. For example, a heat sink is fixed to the back surface of a base member (substrate), to which the motor is fixed, and is exposed outside of the casing, thereby dissipating the heat of the motor outside of the exposure unit. The heat sink includes, for example, a plurality of fins, which are arrayed in parallel with each other and have the same height. The heat sink is fixed to the base member to generate an air flow from one ends to the other ends of the fins along the fins, thereby enhancing heat dissipation effect.

SUMMARY

An image forming device according to the present disclosure includes an exposure device configured to emit exposure light and an air flow generator configured to generate an air flow. The exposure device includes a heat source that generates heat and a heat sink configured to dissipate the heat. The heat sink includes a plurality of fins located inside the air flow. The plurality of fins extend in a direction parallel to a direction where the air flow flows and are arrayed in a direction orthogonal to the direction where the air flow flows. The plurality of fins are formed so as to increase in height from an upstream side toward a downstream side in the direction where the air flow flows.

An exposure device according to the present disclosure exposes a photoreceptor of an image forming device which includes the photoreceptor and an air flow generator that generates an air flow. The exposure device includes a heat source that generates heat, and a heat sink configured to dissipate the heat generated in the heat source. The heat sink includes a plurality of fins located inside the air flow. The plurality of fins extend in a direction parallel to a direction where the air flow flows and are arrayed in a direction orthogonal to the direction where the air flow flows. The plurality of fins are formed so as to increase in height from an upstream side toward a downstream side in the direction where the air flow flows.

DETAILED DESCRIPTION

Embodiments of the present disclosure will be described below with reference to the accompanying drawings.

Figure 1:
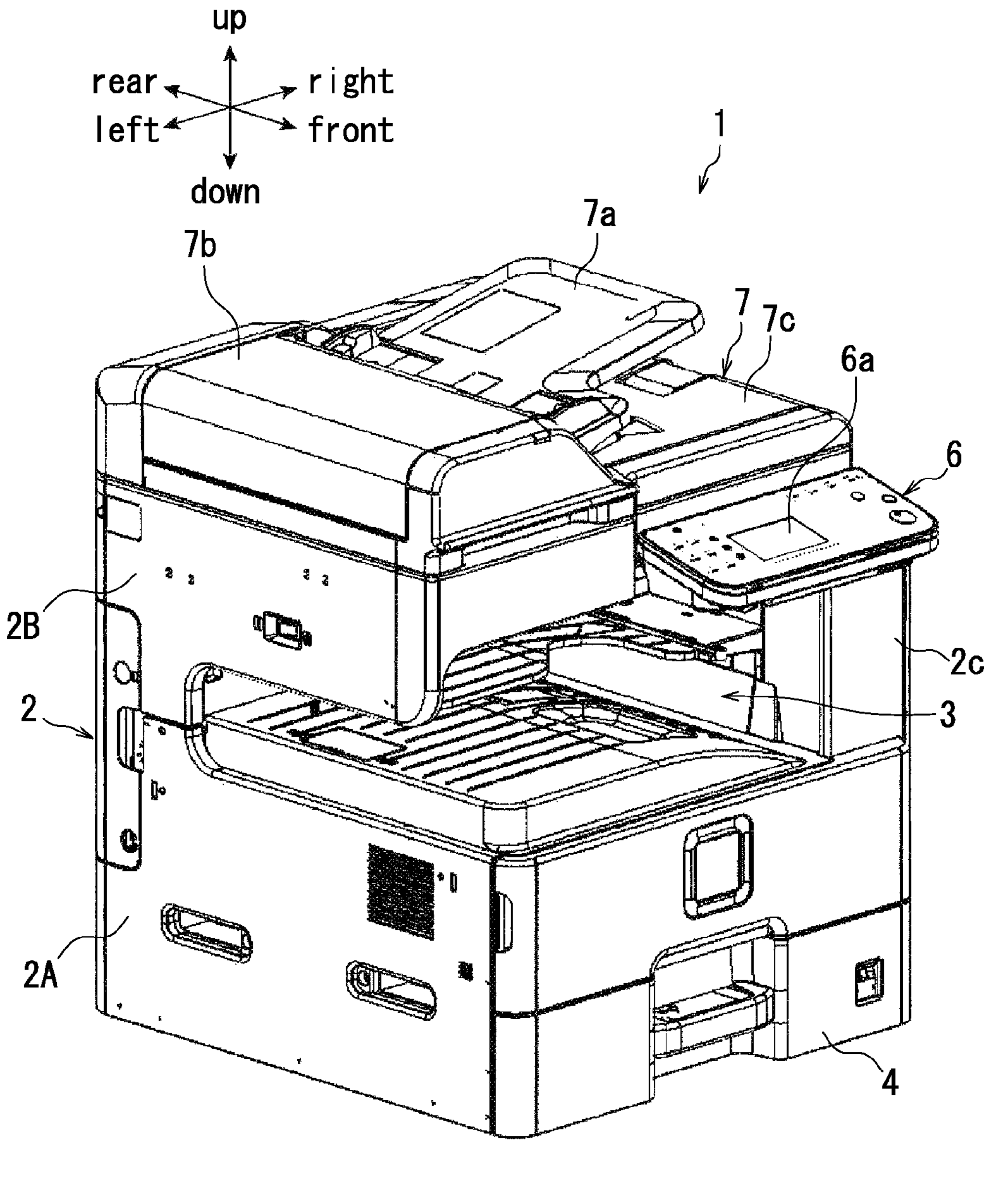
FIG. 1 is a perspective view showing an outer appearance of an image forming device according to the present disclosure.
Figure 2:
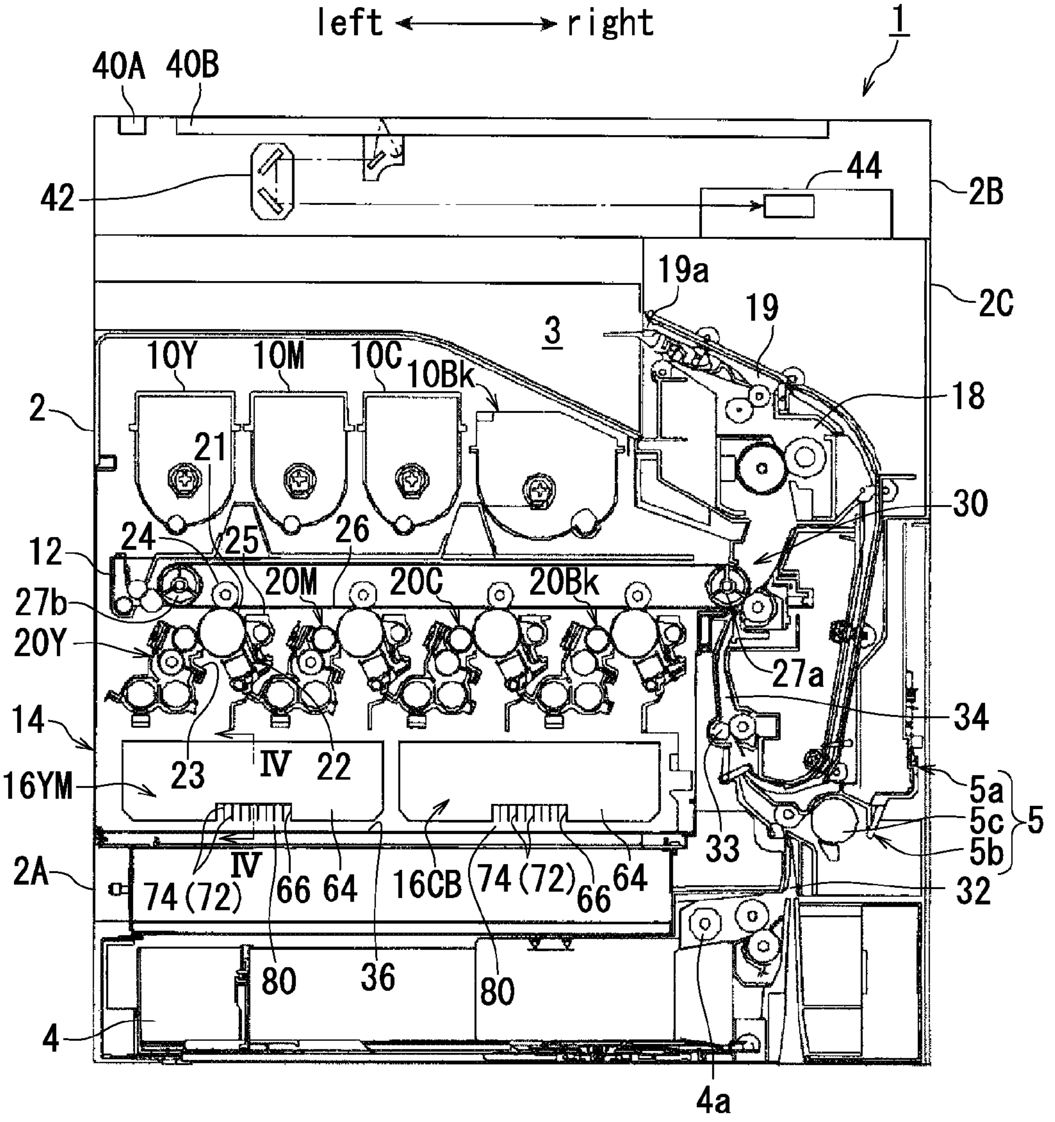
FIG. 2 is a cross sectional view showing an internal configuration of the image forming device.

FIG. 1 is a perspective view showing an outer appearance of an image forming device 1 according to the present disclosure. FIG. 2 is a cross sectional view showing an internal configuration of the image forming device 1. The configuration of the image forming device 1 will be described with reference to FIGS. 1 and 2. A full color copier is illustrated as the image forming device 1. It is noted that in order to clarify the directional relationship, the directions of the image forming device 1 in the drawings are indicated with reference to the position where a user stands when using it. Accordingly, description of the image forming device 1 will be made below with reference to this direction.

The image forming device 1 according to the present embodiment includes a device body 2. The device body 2 has a hollow box structure in substantially rectangular parallelepiped shape to form inside space (inside exit unit 3). The device body 2 is configured to form an image on a sheet.

The device body 2 includes a lower box body 2A in substantially rectangular parallelepiped shape, an upper box body 2B in substantially rectangular parallelepiped shape provided above the lower box body 2A, and a joint box body 2C that joins the lower box body 2A and the upper box body 2B together. Further, the inside space surrounded by the lower box body 2A, the upper box body 2B, and the joint box body 2C defines the inside exit unit 3 capable of accommodating a sheet after image formation. The sheet after image formation is fed from an exit port 19*a* (see FIG. 2) to the inside exit unit 3 and is then stacked on the upper part of the lower box body 2A.

A paper feed cassette 4 configured to accommodate a sheet, on which an image is to be formed, is fitted in the lower box body 2A. The paper feed cassette 4 is capable of being drawn in front from the front of the lower box body 2A. The paper feed cassette 4 is a cassette provided for automatic paper supply.

A multi tray unit 5 is fitted to the right side surface of the device body 2. The multi tray unit 5 includes a paper feed tray 5*a* on which a sheet is manually placed and a paper feed unit 5*b* configured to convey the manually placed sheet to an image forming section 14 (see FIG. 2) in the lower box body 2A. With this configuration, the user can carry out manual paper feed. The paper feed tray 5*a* is mounted at the lower box body 2A in an openable and closable manner and is closed in a non-use state. In a use state, the paper feed tray 5*a* is opened so that a sheet is placed on the paper feed tray 5*a*.

An operation panel unit 6 is provided in front of the upper box body 2B. The operation panel unit 6 includes an LCD touch panel 6*a*, a numeric keypad, a start key, etc. and receives inputs of various types of operation instructions from the user. The user can input the number of to-be-printed sheets, print density, etc. through the operation panel unit 6.

On the upper box body 2B, an automatic document feeder (ADF) 7 (not shown in FIG. 2) is mounted which is configured to automatically feed an original document to a predetermined document reading position (a first contact glass 40A). The ADF 7 is mounted on the upper box body 2B so that the rear end edge of the ADF 7 is rotatable about the upper box body 2B. The ADF 7 includes a document feed tray 7*a* on which an original document is placed, a conveyance section 7*b* configured to convey the original document via a document reading position, and a document exit tray 7*c* to which the read original document is fed.

Next, the internal configuration of the device body 2 will be described with reference to FIG. 2. The lower box body 2A accommodates therein a tonner container group (a tonner container 10Y, a tonner container 10M, a tonner container 10C, and a tonner container 10Bk), an intermediate transfer unit 12, the image forming section 14, an exposure unit 16YM, an exposure unit 16CB, and the paper feed cassette 4 in this order from above. It is noted that each of the exposure unit 16YM and the exposure unit 16CB may be referred to as an exposure device in the present specification.

The image forming section 14 includes, in order to form a full color toner image, four image forming units (an image forming unit 20Y, an image forming unit 20M, an image forming unit 20C, and an image forming unit 20Bk). The image forming unit 20Y forms a yellow (Y) toner image. The image forming unit 20M forms a magenta (M) toner image. The image forming unit 20C forms a cyan (C) toner image. The image forming unit 20Bk forms a black (Bk) toner image. Each of the image forming unit 20Y, the image forming unit 20M, the image forming unit 20C, and the image forming unit 20Bk includes a photosensitive drum 21, a charger 22, a developing unit 23, a primary transfer roller 24, and a cleaning unit 25. The charger 22, the developing unit 23, the primary transfer roller 24, and the cleaning unit 25 are arranged around the photosensitive drum 21.

The photosensitive drum 21 rotates about the axis of itself to form an electrostatic latent image and a toner image on the peripheral surface of itself. For the photosensitive drum 21, a photosensitive drum made of amorphous silicon (a-Si) based material may be used. The charger 22 is configured to electrostatically charge the surface of the photosensitive drum 21 uniformly. The electrostatically charged peripheral surface of the photosensitive drum 21 is exposed by the exposure unit 16YM or the exposure unit 16CB so that an electrostatic latent image is formed on the peripheral surface of the photosensitive drum 21.

The developing unit 23 supplies toner to the peripheral surface of the photosensitive drum 21 in order to develop the electrostatic latent image formed on the photosensitive drum 21. The developing unit 23 is for a two-component developer, for example. The developing unit 23 includes therein a stirring roller, a magnetic roller, a developing roller, etc.

The primary transfer roller 24 is configured to primarily transfer the toner image on the photosensitive drum 21 onto an intermediate transfer belt 26. The intermediate transfer belt 26 is provided in the intermediate transfer unit 12. The primary transfer roller 24 and the photosensitive drum 21 interpose the intermediate transfer belt 26 to form a nip. The cleaning unit 25 cleans the peripheral surface of the photosensitive drum 21 after transfer of the toner image.

The yellow tonner container 10Y, the magenta tonner container 10M, the cyan tonner container 10C, and the black tonner container 10Bk of the tonner container group each store toner of corresponding color. The toner in the respective colors is supplied to the respective developing units 23 of the image forming unit 20Y, the image forming unit 20M, the image forming unit 20C, and the image forming unit 20Bk through respective supply paths (not shown in the drawings).

The exposure unit 16YM forms an electrostatic latent image based on image data of a document image onto the peripheral surface of each photosensitive drum 21 of the image forming unit 20Y and the image forming unit 20M. Similarly, the exposure unit 16CB forms an electrostatic latent image based on the image data of the document image onto the peripheral surface of each photosensitive drum 21 of the image forming unit 20C and the image forming unit 20Bk. The configurations of the exposure unit 16YM and the exposure unit 16CB will be described later.

The intermediate transfer unit 12 includes the intermediate transfer belt 26, a drive roller 27*a*, and a driven roller 27*b*. Toner images of the photosensitive drums 21 of the image forming unit 20Y, the image forming unit 20M, the image forming unit 20C, and the image forming unit 20Bk are each transferred onto the intermediate transfer belt 26 (primary transfer). The toner images transferred from the respective photosensitive drums 21 and overlaid one on top of the other are transferred to a sheet supplied from the paper feed cassette 4 or the paper feed tray 5*a* in a secondary transfer section 30 (secondary transfer).

The paper feed cassette 4 accommodates a sheaf of a plurality of stacked sheets. A pickup roller 4*a* is disposed on the upper right side of the paper feed cassette 4. Driving the pickup roller 4*a* allows the sheets in the paper feed cassette 4 to be fed one by one from the uppermost sheet of the sheaf. Then, the sheets are conveyed to a carry-in path 32. By contrast, driving the paper feed roller 5*c* of the paper feed unit 5*b* allows a sheet placed on the paper feed tray 5*a* to be conveyed to the carry-in path 32.

On the downstream side of the carry-in path 32, a sheet conveyance path 34 is provided which extends to the exit port 19*a* via the secondary transfer section 30, a fixing unit 18, and a paper exit unit 19. A paper stop roller pair 33 is disposed on the upstream side of the secondary transfer section 30 in the sheet conveyance path 34. The sheet is once stopped at the paper stop roller pair 33 to be subjected to skew correction and then is sent to the secondary transfer section 30 at predetermined timing for image transfer.

The fixing unit 18 and the paper exit unit 19 are accommodated inside the joint box body 2C. The fixing unit 18 includes a fixing roller and a pressure roller. The secondary transfer section 30 heats and pressurizes the sheet, to which the toner images are secondary transferred, to fix the toner images to the sheet. The paper exit unit 19 arranged on the downstream side of the fixing unit 18 feeds the sheet with the color images subjected to fixing treatment from the exit port 19*a* toward the inside exit unit 3.

The first contact glass 40A and a second contact glass 40B are fitted in the upper surface of the upper box body 2B. The first contact glass 40A is provided to read an original document sheet automatically fed from the ADF 7. The second contact glass 40B is provided to read a manually placed original document sheet.

The upper box body 2B accommodates therein an image sensor 44 and a scanning mechanism 42 configured to optically read document information. The scanning mechanism 42 includes a light source, a moving carriage, a reflecting mirror, etc. and brings reflected light from an original document to the image sensor 44. The image sensor 44 is configured to perform photoelectric conversion of the reflected light to an analog electrical signal. The analog electrical signal is converted to a digital electrical signal in an A/D conversion circuit (not shown in the drawings) and is then input to the exposure unit 16YM and the exposure unit 16CB.

The configurations of the exposure unit 16YM and the exposure unit 16CB will be described next with reference to FIGS. 2-6.

As shown in FIG. 2, the exposure unit 16YM is arranged across the image forming unit 20Y and the image forming unit 20M below the image forming unit 20Y and the image forming unit 20M. The exposure unit 16CB is arranged across the image forming unit 20C and the image forming unit 20Bk below the image forming unit 20C and the image forming unit 20Bk.

Figure 3:
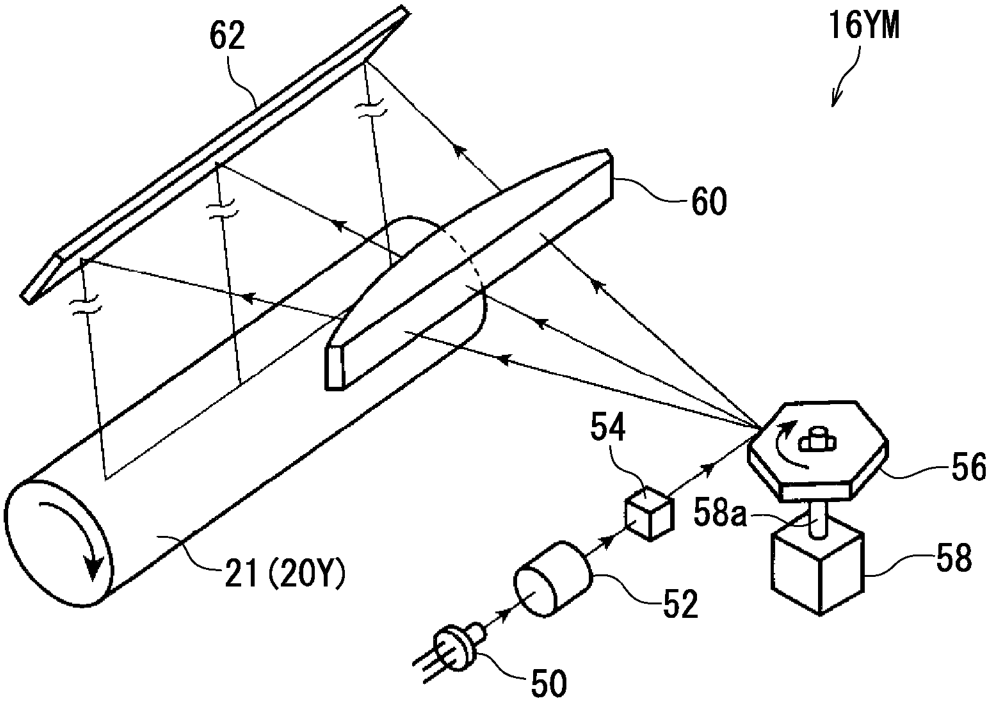
FIG. 3 is a schematic illustration showing a configuration of an exposure device.

FIG. 3 is an explanatory diagram schematically showing the main components of the exposure unit 16YM. The exposure unit 16YM exposes a photoreceptor of an image forming device that includes the photoreceptor and an air flow generator configured to generate an air flow. The exposure unit 16YM includes a laser light source 50, a collimating lens 52, a cylindrical lens 54, a polygon mirror (rotary polygon mirror) 56, a polygon motor 58, an fθ lens 60, and a reflecting mirror 62.

The laser light source 50 is formed of a semiconductor laser oscillator of a diode laser or the like. The laser light source 50 outputs, along a predetermined optical axis, laser light (exposure light) of which light amount is adjusted according to analog voltage for control output from a control section (not shown in the drawings).

The collimating lens 52 is arranged in the vicinity of the laser light source 50 and is configured to adjust the beam diameter of the laser light output from the laser light source 50. The cylindrical lens 54 is configured to further adjust the beam diameter of the laser light transmitted through the collimating lens 52. The polygon minor 56 is driven and rotated at a predetermined speed by the polygon motor 58 to deflect the laser light so that the laser light output from the cylindrical lens 54 scans the photosensitive drum 21 in the longitudinal direction (main scanning direction) of the photosensitive drum 21 (photoreceptor: 20Y). The fθ lens 60 brings the laser light to the reflecting minor 62 so that the laser light scans the photosensitive drum 21 at a predetermined speed in the main scanning direction of the photosensitive drum 21. The reflecting mirror 62 reflects the laser light output from the fθ lens 60 and brings it to the photosensitive drum 21.

It is noted that the exposure unit 16YM further includes, besides the fθ lens 60 and the reflecting minor 62, an fθ lens and a reflecting minor (not shown in the drawings) to lead the laser light onto the photosensitive drum 21 of the image forming unit 20M. In other words, accompanied by rotation of the polygon mirror 56, the exposure unit 16YM performs scan while emitting a laser light beam to the respective photosensitive drums 21 of the image forming unit 20Y and the image forming unit 20M, thereby forming an electrostatic latent image on each photosensitive drum 21.

Description about the configuration of the exposure unit 16YM has been made with reference to FIG. 3. The exposure unit 16CB has the same configuration as the exposure unit 16YM except that the laser light beam is emitted to the respective photosensitive drums 21 of the image forming unit 20C and the image forming unit 20Bk.

Figure 4:
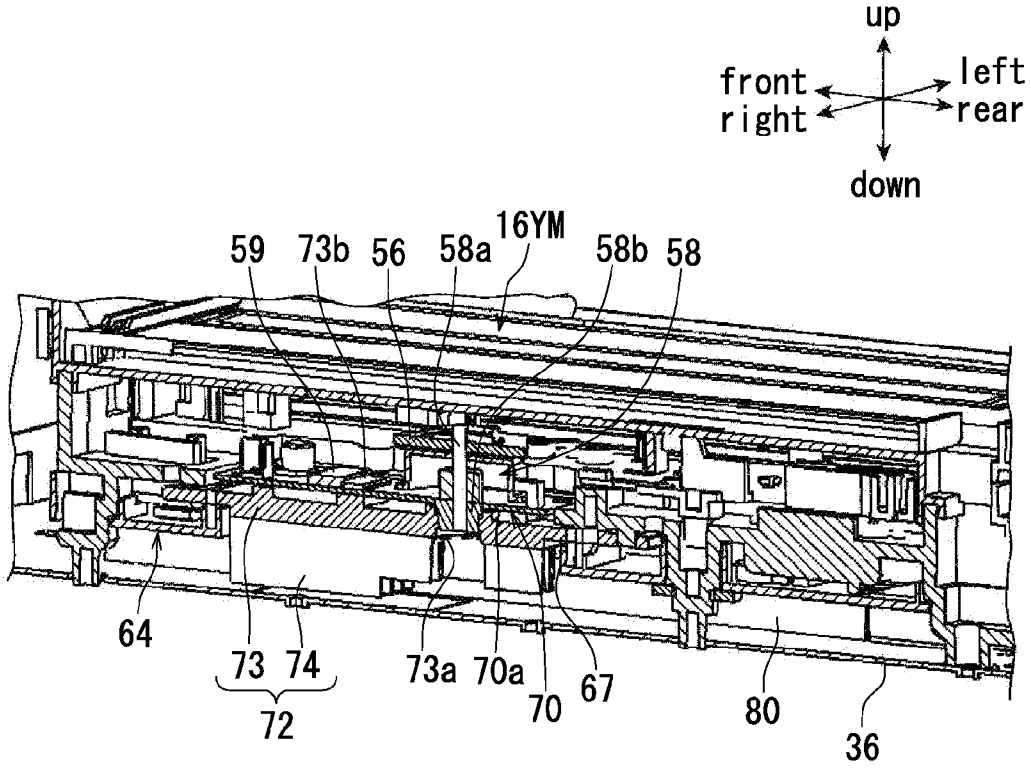
FIG. 4 is a perspective cross sectional view showing an internal configuration of the exposure device.

Each of the exposure unit 16YM and the exposure unit 16CB further includes a box-shaped (substantially rectangular parallelepiped shaped) casing 64 flat in the vertical direction. All of the members, such as the laser light source 50, etc. are accommodated in the casing 64. It is noted that the polygon motor 58 is boarded on a control substrate 70, as shown in FIG. 4, and is fixed integrally with the control substrate 70 at the inner bottom of the casing 64. That is, the control substrate 70 includes a substrate main body 70*a* with a circuit on the substrate, the polygon motor 58 boarded on the substrate main body 70*a*, the polygon minor 56 fitted to an output shaft 58*a* of the polygon motor 58, electronic components for controlling driving of the polygon motor 58, such as a driver IC 59, etc., and a heat sink 72 configured to dissipate heat generated at the polygon motor 58 and the driver IC 59 (each corresponds to heat sources in the present disclosure).

The control substrate 70 is fixed to the casing 64 in such a fashion that the polygon motor 58 and the driver IC 59 are arrayed in the back and forth direction, specifically, so that the polygon motor 58 is located behind the driver IC 59. The heat sink 72 is fixed across a region of the lower surface of the substrate main body 70*a* where the polygon motor 58 and the driver IC 59 are boarded.

Figure 5:
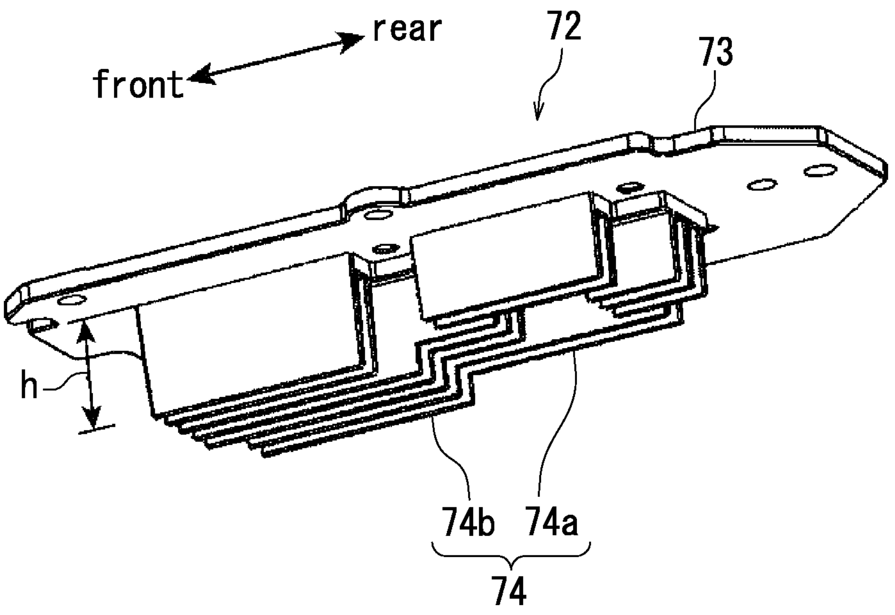
FIG. 5 is a perspective view showing a heat sink.

FIG. 4 is a cross sectional view taken along the lines IV-IV in FIG. 2. The heat sink 72 includes, as shown in FIGS. 4 and 5, a plate-shaped base 73 long and narrow in the back and forth direction and a plurality of fins 74 each suspended from the base 73 and arrayed in parallel to each other in the transverse direction. The heat sink 72 is incorporated in the control substrate 70 in such a manner that the base 73 is fixed to the lower surface of the substrate main body 70*a* by means of a bolt or the like. The base 73 and the fins 74 are integrally formed of a metal material having high thermal conductivity, such as aluminum or copper. In this example, the heat sink 72 is formed by aluminum die casting.

The heat sink 72 is incorporated in the control substrate 70 so as to be in contact with the polygon motor 58 and the driver IC 59. In detail, a through hole 73*a* is formed in each of the substrate main body 70*a* and the heat sink 72 so as to pass through the substrate main body 70*a* and the heat sink 72 in their thickness directions. The polygon motor 58 is fixed to the substrate main body 70*a* with it inserted in the through holes 73*a* or the like so that the bearing portion 58*b* of the polygon motor 58 (bearing portion of the output shaft 58*a*) is in contact with at least the inner peripheral surface of the through hole 73*a* of the heat sink 72.

Further, a protrusion 73*b* is formed at a position frontward of the through holes 73*a* on the upper surfaced of the base 73 of the heat sink 72. The protrusion 73*b* protrudes from the upper surface of the substrate main body 70*a* through a through hole (through hole formed at a position adjacent to the position where the driver IC 59 is to be mounted) formed in the substrate main body 70*a*. The driver IC 59 is boarded (mounted) on the substrate main body 70*a* so as to be in contact with the protrusion 73*b*. In this way, thermal conduction from the polygon motor 58 and the driver IC 59 to the heat sink 72 can be achieved through each contact of the polygon motor 58 and the driver IC 59 with the heat sink 72.

The plurality of fins 74 of the heat sink 72 are formed so as to increase in height h from the rear side toward the front side, as shown in FIGS. 4 and 5. In the present embodiment, each fin 74 is formed stepwise as a whole so that the height in a region 74*b* on the front side from around the middle point in the back and forth direction (hereinafter referred to as a front region 74*b*) is a predetermined height higher than that of a region 74*a* on the rear side from around the middle point in the back and forth direction (hereinafter referred to as a rear region 74*a*). Further, the polygon motor 58 is in contact with the heat sink 72 (the base 73) at its part corresponding to the rear region 74*a* of each fin 74. The driver IC 59 is in contact with the heat sink 72 (the base 73) at its part corresponding to the front region 74*b* of each fin 74.

In the present specification, the rear region 74*a* and the front region 74*b* of each fin 74 may be referred to as a first region and a second region, respectively. Further, in the present specification, the polygon motor 58 and the driver IC 59 may be referred to as a first heat source and a second heat source, respectively. It is noted that the height of the fins 74 is the same entirely across the rear regions 74*a*. Similarly, it is the same entirely across the front regions 74*b*.

The fins 74 protrude below the exposure unit 16YM and the exposure unit 16CB from each casing 64 through an opening 67 formed at each bottom of the casings 64. In detail, recesses 66, which are recessed upward and extend in the back and forth direction, are formed at respective parts, to which the control substrate 70 is fixed, of the bottom surface of the casing 64 of the exposure unit 16CB and the bottom surface of the casing 64 of the exposure unit 16YM, as shown in FIG. 2. The fins 74 protrude from the recesses 66 through each opening 67 formed in the inner bottoms of the recesses 66.

It should be noted that each recess 66 of the casings 64 and a frame member 36 of the lower box body 2A form a wind path (cooling wind path 80) for cooling the exposure unit 16YM or the exposure unit 16CB in the image forming device 1. An air blowing fan 38 (schematically shown in FIG. 6) fitted at the rear part of the lower box body 2A takes and sends the outside air into the cooling wind path 80 to generate an air flow flowing from the rear side toward the front side inside the cooling wind path 80. That is, the fins 74 of the heat sink 72 are disposed inside the cooling wind path 80 so as to extend in the direction parallel to the direction where the air flow flows and so as to be arrayed in the direction orthogonal to the direction where the air flow flows. It is noted that the air blowing fan 38 may be referred to as an air flow generator in the present specification.

With the above configuration, in the image forming device 1, the heat of each of the exposure unit 16YM and the exposure unit 16CB (i.e., heat generated at each polygon motor 58 and each driver IC 59) is dissipated through the heat sink 72. In this case, the fins 74 are arranged inside the cooling wind path 80 to allow the air to flow among the fins 74, thereby promoting heat transfer (heat dissipation) from the heat sink 72 to the flowing air. Thus, the heat can be favorably dissipated from the exposure unit 16YM and the exposure unit 16CB.

In particular, the heat sink 72 has the configuration in which the fins 74 increase in height h from the rear side toward the front side (from upstream side toward the downstream side in the direction where the air flow flows), which can results in efficient heat dissipation from the heat sink 72. Specifically, for example, in the case where the height of the fins 74 of the heat sink 72 is the same in the entire region in the back and forth direction, the temperature of the air increases in the course of air flowing in the fins 74. As a result, the heat dissipation effect is reduced dominantly in the front regions of the fins 74 (regions on the downstream side in the direction where the air flow flows) compared with in the rear regions thereof.

Figure 6:
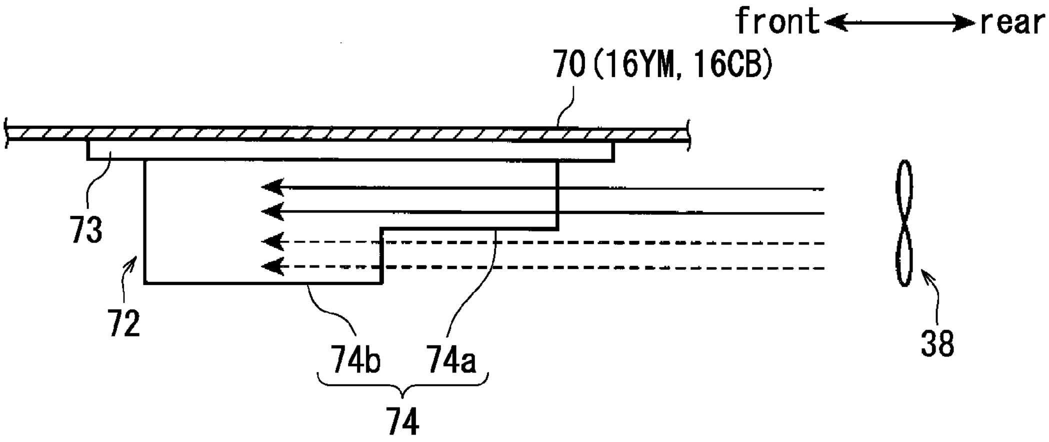
FIG. 6 is a schematic cross sectional view showing the main part of the exposure device for explaining the relationship between an air flow and heat dissipation effect by the heat sink.

By contrast, with the fins 74 in stepwise shape in which their height h increases from the rear side toward the front side (from upstream side toward downstream side in the direction where the air flow flows) as in the above described present embodiment, the air at comparatively low temperature (i.e., air of which temperature is comparatively low because it does not flow through the rear regions 74*a;* indicated by the broken arrows in FIG. 6) flows in a given region including the tip ends of the fins 74 in the front regions 74*b* of the fins 74, as schematically shown in FIG. 6. Accordingly, a phenomenon that the heat dissipation effect reduces in the front regions 74*b* of the fins 74 can be prevented, thereby enhancing the heat dissipation effect in the heat sink 72 as a whole.

Thus, according to the image forming device 1 of the present embodiment, the heat sink 72, which is comparatively small in size, can efficiently dissipate the heat of the exposure unit 16YM and the exposure unit 16CB (each polygon motor 58 and each driver IC 59). In other words, it is unnecessary to provide a large heat sink for each of the exposure unit 16YM or the exposure unit 16CB (each control substrate 70) and to provide a large air blow fan, while the heat dissipation effect of the exposure unit 16YM and the exposure unit 16CB can be enhanced.

It is noted that the image forming device 1 according to the present embodiment illustrates one example of the image forming device of the present disclosure, and its specific configuration can be appropriately modified within the scope not deviated from the subject matter of the present disclosure.

Figure 7:
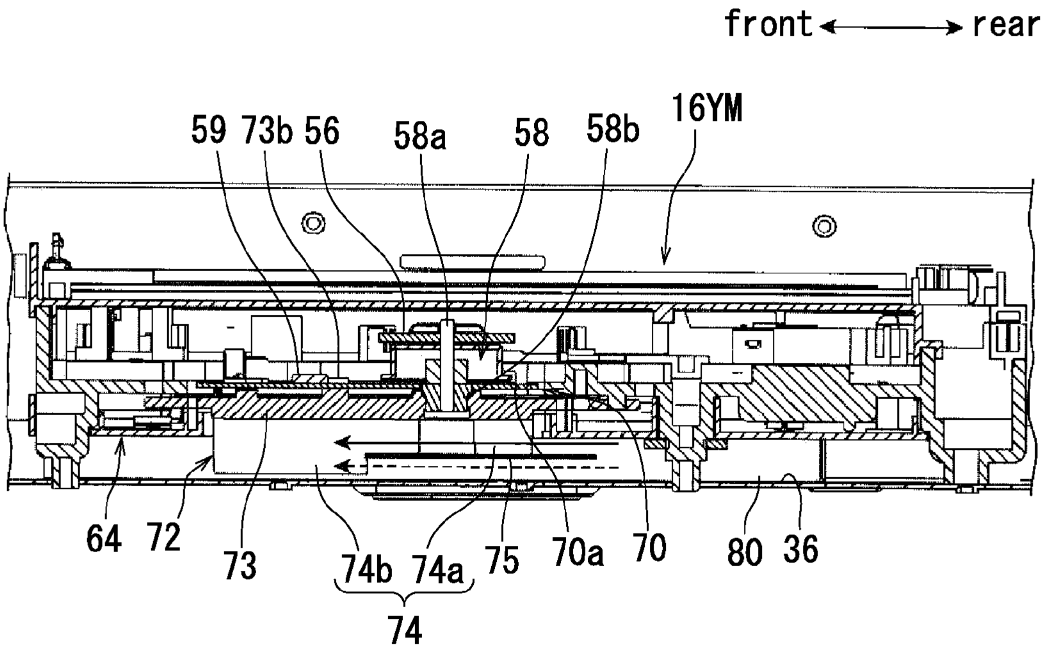
FIG. 7 is a cross sectional view showing an internal configuration of an exposure device (modified example).

For example, the heat sink 72 boarded on the control substrate 70 may include a partition plate 75, as shown in FIG. 7. The partition plate 75 partitions the air flow flowing along the fins 74 at a predetermined position in the height direction (vertical direction) of the fins 74. The partition plate 75 is connected to the tip ends of the fins 74 over the rear regions 74*a* of the fins 74. With this configuration, the air can stably flow along the partition plate 75 to be prevented from flowing turbulently in the height direction of the fins 74. Accordingly, the air at comparatively low temperature flowing in the region including the fin tip ends in the front regions 74*b* (air not flowing through the rear regions 74*a;* indicated by the broken arrow in the drawing) can flow more reliably.

It is noted that in order to enhance the heat dissipation effect, it is desirable that the partition plate 75 is made of aluminum or copper having high thermal conductivity, similarly to the base 73 and the fins 74. In this case, in view of producibility, it is suitable that the base 73, the fins 74, and the partition plate 75 of the heat sink 72 are integrally formed by aluminum die casting or the like.

Further, the shape of the fins 74 are not limited to the shape in which their height increases by only one step in the middle in the back and forth direction, as shown in FIG. 5, and may have a shape in which their height successively increases in steps of two or more. In this case, the partition plate 75 (see FIG. 7) may be provided in each of regions of the fins 74 with different heights to partition the path of the air flow along the height direction of the fins 74.

Figure 8:
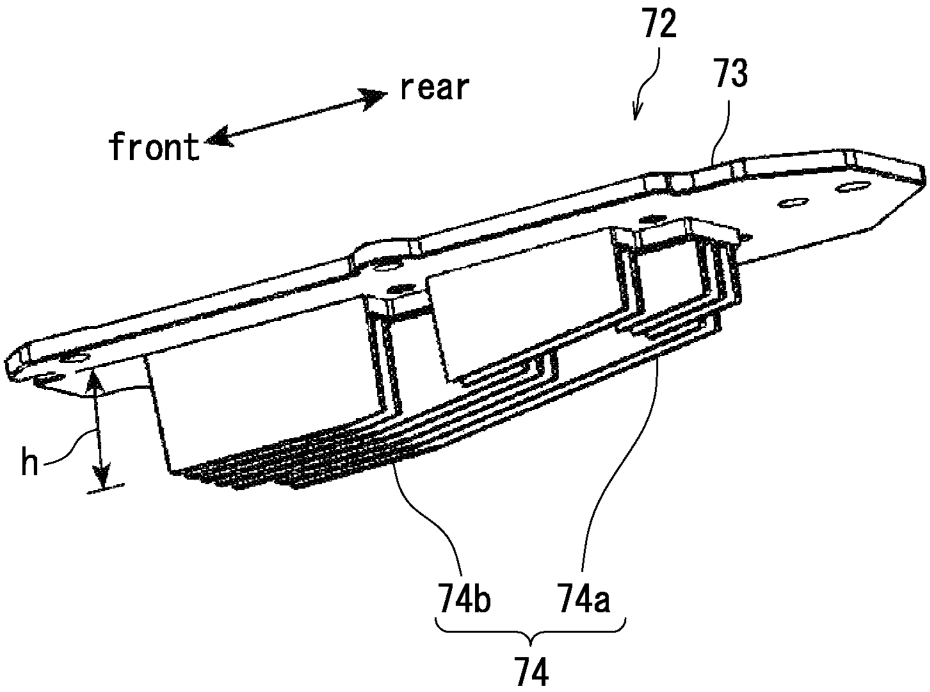
FIG. 8 is a perspective view showing a modified example of a heat sink.
Figure 9:
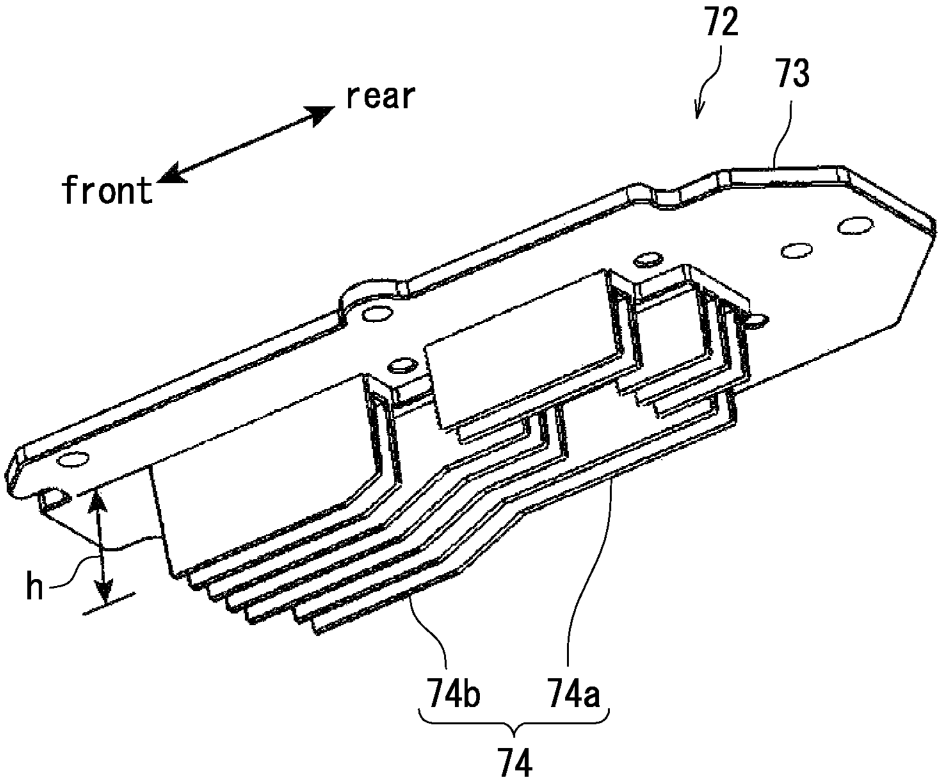
FIG. 9 is a perspective view showing another modified example of a heat sink.

Furthermore, the shape of the fins 74 is not limited to the above shape in which the height h changes stepwise as above, as long as their height increases from the rear side toward the front side (from the upstream side toward the downstream side in the direction where the air flow flows). For example, as shown in FIG. 8, each rear region 74*a* may be a region in which the height of the fins 74 linearly changes (increases) (height increasing region). Alternatively, though not shown in the drawing, the fins 74 may each have a region in which the height h of the fins 74 linearly changes (increases) over the entire region of the fins 74 (height increasing region). More-over, as shown in FIG. 9, the fins 74 may have a region in which their height linearly changes (increases) between the rear region 74*a* and the front region 74*b* of the fin 74 (height increasing region). The heat sink 72 with the fins 74 having such a height increasing region can also exert operation and effects equivalent to these of the hat sink 72 shown in FIG. 5 and the like. In addition, with this configuration, the fins 74 can be increased in height from the upstream side toward the downstream side in the direction where the air flow flows, while the heat dissipation area of the fins 74 can be secured largely. It is noted that each heat sink 72 as shown in FIGS. 8 and 9 may also include the partition plate 75 (see FIG. 7). In the case with the heat sink 72 shown in FIG. 8, for example, a slit extending horizontally from the rear end part of each fin 74 may be formed at a specific height of each fin 74, and the partition plate 75 may be inserted therein to be fixed.

In addition, the air flow flowing from the rear side toward the front side inside the cooling wind path 80 is formed by sending the outside air into the cooling wind path 80 by the air blowing fan 38 provided in the lower box body 2A in the image forming device 1 according to the present embodiment. Alternatively, for example, an exhaust fan may be provided to exhaust the air inside the cooling wind path 80. This can generate the air flow flowing from the rear side toward the front side inside the cooling wind path 80.

It is noted that in the present embodiment of the present disclosure, a generally-called full color copier has been described as the image forming device 1, but the image forming device may be a printer, a facsimile machine, an image forming device that forms a monochrome image, or a multifunction device having functions thereof.

What is claimed is:

1. An image forming device comprising:

an exposure device configured to emit exposure light; and an air flow generator configured to generate an air flow, the exposure device including a heat source that generates heat and a heat sink configured to dissipate the heat, the heat sink including a plurality of fins located inside the air flow, each of the plurality of fins having side surfaces and a top surface, the plurality of fins extend in a direction parallel to a direction of the air flow and being arrayed in a direction orthogonal to the direction of the air flow, and the top surface of each of the plurality of fins increasing in height from an upstream side toward a downstream side in the direction of the air flow, each of the plurality of fins a first region as a height increasing region and a second region as a height constant region, and the heat sink including a partition plate inserted in a slit extending horizontally in the height increasing region of each of the plurality of fins.

2. The image forming device of claim wherein the exposure device includes:

a rotary polygon mirror configured to deflect the exposure light; and a motor configured to drive and rotate the rotary polygon mirror;

wherein the heat source is the motor.

* * * * *